(12) United States Patent
Ebihara et al.

(10) Patent No.: US 6,847,580 B2
(45) Date of Patent: Jan. 25, 2005

(54) METHOD OF CONTROLLING DATA READING CAPABLE OF INCREASING DATA TRANSFER RATE IN SDRAM OF THE POSTED CAS STANDARD

(75) Inventors: Minoru Ebihara, Tokyo (JP); Tsugio Takahashi, Tokyo (JP); Hiroshi Watanabe, Tokyo (JP)

(73) Assignee: Elpida Memory, Inc. (JP)

( * ) Notice: Subject to any disclaimer, the term of this patent is extended or adjusted under 35 U.S.C. 154(b) by 115 days.

(21) Appl. No.: 10/282,810

(22) Filed: Oct. 29, 2002

(65) Prior Publication Data
US 2003/0086329 A1 May 8, 2003

(30) Foreign Application Priority Data
Nov. 8, 2001 (JP) ........................................ 2001-343551

(51) Int. Cl.[7] ................................................. G11C 8/00
(52) U.S. Cl. .................................. 365/233; 365/230.03
(58) Field of Search .............................. 365/233, 230.03

(56) References Cited

U.S. PATENT DOCUMENTS 6,067,257 A * 5/2000 Kitsukawa et al. ..... 365/189.11
6,388,937 B2 * 5/2002 Takeyama et al. ...... 365/230.03

* cited by examiner

Primary Examiner—Hoai Ho
(74) Attorney, Agent, or Firm—Hayes Soloway P.C.

(57) ABSTRACT

A method for controlling reading data that can increase the data transfer rate in an SDRAM of a posted CAS standard. A memory cell array is constituted by two sub-arrays that can be independently activated. When a READ command is received as an input one clock cycle after the input of an ACTV command, a row decoder activates only the sub-array containing the memory cell that is selected by a row address AX and column address AY, and then carries out the operations for reading data. The present invention thus reduces the areas that must be activated, thereby decreasing the load on the power supply and, when amplifying bit lines, shortening the time for the voltage of bit lines to attain the stipulated voltage. Consequently, the present invention increases the speed of reading data.

7 Claims, 17 Drawing Sheets

Fig. 2
PRIOR ART

| | /CS | /RAS | /CAS | /WE |
|---|---|---|---|---|
| ACTV command | L | L | H | H |
| READ command | L | H | L | H |
| PRE command | L | L | H | L |

METHOD OF CONTROLLING DATA READING CAPABLE OF INCREASING DATA TRANSFER RATE IN SDRAM OF THE POSTED CAS STANDARD

BACKGROUND OF THE INVENTION

1. Field of the Invention

The present invention relates to a semiconductor memory device such as SDRAM (Synchronous Dynamic Random Access Memory); and more particularly to a semiconductor memory device such as SDRAM of a posted CAS specification that allows free selection of the time interval from the input of an ACTV command, which is a command instructing the selection of a row address, to the input of a READ command, which is a command instructing the selection of a column address; and to a method of controlling the reading of data from this type of semiconductor memory device.

2. Description of the Related Art

With the increase in CPU speed in recent years has come the demand for DRAM having the capability to read and write data at higher speeds. SDRAM, in which operations are carried out at higher speeds by operating in synchronization with an external clock signal, has come into wide use to achieve these higher data transfer rates. Even higher data transfer rates are achieved through the use of DDR (Double-Data-Rate) SDRAM, in which higher data transfer speeds are realized by transferring data at both the falling and rising edges of a clock signal.

In addition, the DDR-II specification, which is a method for handling the higher speeds of DDR, is now under investigation to achieve a further increase in speed. This DDR-II standard allows a lower power-supply voltage and a clock frequency of 400 MHz or more. We now refer to FIG. 1, which is a block diagram showing the simplified structure of such an SDRAM. The SDRAM shown in this figure is provided with: clock generator 10, control circuit 11, address buffer 12, row decoder 13, column decoder 14, memory cell array 15 that is constituted by a plurality of memory cells provided at each intersection of word lines and bit lines, and data input/output buffer 16.

Clock generator 10 receives as input differential clock inputs CK, /CK, and CKE (Clock Enable), generates clock signal CLK, and outputs this clock signal to each circuit.

Control circuit 11 receives as input /CAS (Column Address Strobe), /RAS (Row Address Strobe), /WE (Write Enable), and /CS (Chip Select); and controls the writing and reading of data to each memory cell of memory cell array 15. Here, as shown in FIG. 2, control circuit 11 operates as if an ACTV command, which is a command instructing the selection of row address, has been received when /CS is L, /RA is L, /CAS is H, and /WE is H; operates as if a READ command, which is a command instructing the selection of a column address, has been received when /CS is L, /RAS is H, /CAS is L, and /WE is H; and operates as if a PRE command, which is a command instructing precharging, when /CS is L, /RAS is L, /CAS is H, and /WE is L.

More specifically, upon receiving an ACTV command, control circuit 11 outputs address control signal $20_1$ to address buffer 12 and then activates control signal $\phi 1$ for controlling row decoder 13. Upon receiving a READ command, control circuit 11 outputs address control signal 202 to address buffer 12 and then activates both control signal $\phi 2$ for controlling column decoder 14 and control signals $\phi 3$ for controlling data input/output buffer 16. Then, after receiving a PRE command, control circuit 11 inactivates both address control signal $20_1$ and control signal $\phi 1$ to row decoder 13.

Address buffer 12 receives bank selection signal BA and address signal A, and when address control signal $20_1$ becomes active, address buffer 12 outputs row address AX within address signal A to row decoder 13, and when address control signal $20_2$ becomes active, outputs column address AY within address signal A to column decoder 14.

SDRAM is actually constituted by a plurality of banks, and address buffer 12 outputs row address AX and column address AY only when a received bank selection signal BA selects the relevant memory cell array 15, but for the sake of simplification in the following explanation, bank selection signal BA will be assumed to select memory cell array 15.

When row decoder 13 receives row address AX from address buffer 12 and control signal $\phi 1$ becomes active, row decoder 13 both activates the word line that corresponds to received row address AX of the plurality of word lines WL and activates sense amplifier control signal SAC. When column decoder 14 receives column address AY from address buffer 12 and control signal $\phi 2$ becomes active, column decoder 14 activates the column selection signal that corresponds to received column address AY of the plurality of column selection signals YS. When control signal $\phi 3$ becomes active, data input/output buffer 16 outputs the data from memory cell array 15 as output data DQ.

The structure of memory cell array 15 in FIG. 1 is shown in FIG. 3. In FIG. 3, memory cell array 15 is described as an array that is constituted by m×n memory cells (MC). As shown in FIG. 3, memory cell array 15 is made up of m columns, each column being provided with n memory cells. Each column is provided with a respective precharge circuit (PRE), sense amplifier, and Y-switch circuit. The precharge circuit that is provided in each column is controlled by precharge signal PDL from row decoder 13. The sense amplifier that is provided for each column is similarly controlled by sense amplifier control signal SAC from row decoder 13. The Y-switch circuits that are provided in each column are independently controlled by column selection signals $YS_1$–$YS_m$ from column decoder 14, and only the Y-switch circuit of a column that is indicated by a column address AY is activated. Finally, in FIG. 1, word lines $WL_1$–$WL_n$ are simply indicated as WL and column selection signals $YS_1$–$YS_m$ are simply indicated as YS.

We next refer to the timing chart of FIG. 4 to describe the operations when reading data from the SDRAM shown in FIG. 1.

First, the input of an ACTV command, which is a command instructing the selection of a row address, to control circuit 11 causes address control signal $20_1$ to be output from control circuit 11 and a row address AX to be output from address buffer 12 to row decoder 13. The activation of control signal $\phi 1$ by control circuit 11 then causes row decoder 13 to both deactivate precharge signal PDL and select the word line that corresponds to the received row address AX of word lines $WL_1$–$WL_n$. Row decoder 13 then activates sense amplifier control signal SAC for activating the sense amplifiers of memory cell array 15, whereby the word lines WL that contain memory cells for which data are to be read are activated, and data are read to bit lines BL and /BL and the bit lines amplified. Of the area of memory cell array 15, the area that is activated by the processes up to this point is shown in FIG. 5. In FIG. 5, a case is shown in which word line $WL_3$ has been activated by row decoder 13, and the activated area is indicated by diagonal lines.

A READ command instructing the selection of a column address is received as input from external system two clocks, i.e., tRCD, after the ACTV command has been received, whereupon control circuit 11 activates both address control signal $20_2$ and control signal $\phi2$. The activation of these signals causes column address AY to be applied as input from address buffer 12 to column decoder 14, whereby only column selection signals that are indicated by the column address AY of column selection signals $YS_1$–$YS_m$ are activated, and the memory cells that are to be read are selected. The activation of control signal $\phi3$ then causes the data from the selected memory cells to be output from data input/output buffer 16 as data DQ.

When precharge command PRE is subsequently received as input, control circuit 11 deactivates control signal $\phi1$, whereby row decoder 13 deactivates the word lines WL that were active, deactivates sense amplifier control signal SAC, and activates precharge signal PDL. Bit lines BL and /BL are reset by these operations in preparation for the next data reading of memory cells.

In an SDRAM of this type, a certain amount of time is required from the time that the word lines WL are selected by row decoder 13, the sense amplifier control signal SAC becomes active, and the sense amplifier begins to operate until the time that the amplification of the bit lines ends. As a result, the selection of bit lines by column selection signals $YS_1$–$YS_m$ must wait until the end of the amplification of the bit lines. More specifically, when applying a READ command after applying an ACTV command as input in an SDRAM of the prior art, the passage of a stipulated time tRCD must be guaranteed in the external system that controls the reading and writing of data. In other words, tRCD is stipulated for guaranteeing time for the amplification of bit lines BL and /BL to end after the input of an ACTV command. The timing chart shown in FIG. 4 shows a case in which two clocks are stipulated as this time tRCD. This type of constraint necessitates extra work in the external system control.

The adoption of a posted CAS standard in the above-described DDR-II SDRAM is being investigated for the purpose of eliminating this constraint on the external system and facilitating control. This posted CAS standard is free from the tRCD constraint, i.e., that a number of clocks that must be guaranteed from the input of an ACTV command until the input of a READ command and allows the external system to continuously apply an ACTV command and READ command.

We next refer to the timing chart of FIG. 6 of an SDRAM in which this type of posted CAS standard has been adopted. The timing chart shown in FIG. 6 differs from the timing chart of FIG. 4 in that a READ command is applied as input immediately after the input of an ACTV command, and in that the input of the READ command to control circuit 11 causes column address AY to be output to column decoder 14 more quickly than in the prior art.

In this posted CAS SDRAM, control circuit 11 controls the timing of the output of control signal $\phi2$ for controlling the timing at which column decoder 14 outputs column selection signal YS, whereby the output of the data of bit lines to data input/output buffer 16 before the completion of amplification of the bit lines is prevented for cases in which a READ command is applied as input to control circuit 11 before the passage of tRCD after the input of an ACTV command.

Thus, in this type of posted CAS SDRAM, control circuit 11 stores tRCD in advance such that even when a column address is selected before the passage of tRCD, control circuit 11 exercises control in place of the external system over the timing of actual execution of a READ command that was controlled by the external system of the prior art.

As a result, in this posted CAS SDRAM, an external system can execute a READ command without having to make allowances for tRCD. In other words, the external system can execute a READ command immediately after, i.e., one clock after, executing an ACTV command, whereby the control for reading data can be facilitated in the external system that controls data reading.

In this case, the number of cycles following a READ command until tRCD is referred to as AL (Additive Latency). In the example shown in FIG. 6, AL=1. In this posted CAS SDRAM, however, a column address AY must be latched for a period of time that is determined by AL.

As described in the foregoing explanation, the use of DDR-II SDRAM enables the realization of a semiconductor memory device having a higher data transfer rate. Further, an SDRAM that employs the posted CAS standard increases the freedom of control in the external system and therefore can realize a semiconductor memory device that facilitates control by an external system. Even when the posted CAS standard is used, however, the number of cycles that are required from the input of an ACTV command until the output of data DQ is tRCD+CL (CAS Latency), and therefore is identical to an SDRAM of the prior art that does not employ the posted CAS standard.

In other words, despite the use of posted CAS SDRAM in the semiconductor memory device of the above-described prior art, the time from the input of an ACTV command until the actual output of data is no different from a case in which the posted CAS standard is not used, and the problem remains that tRCD constituted a rate-determining condition, and an increase in the data transfer rate could not be achieved.

SUMMARY OF THE INVENTION

It is an object of the present invention to provide a semiconductor memory device that can increase the data transfer rate in SDRAM of the posted CAS standard, and to provide a method of controlling the reading of data of such a semiconductor memory device.

The present invention is applicable to a semiconductor memory device that employs the posted CAS standard that allows free selection of the timing from the input of an ACTV command, which is a command instructing the selection of a row address, until the input of a READ command, which is a command instructing the selection of column address.

To achieve the above-described object, the semiconductor memory device of the present invention is provided with: a memory cell array that is constituted by a plurality of sub-arrays that can be independently activated; column decoders for selecting columns that are specified by a column address that is received as input; a control circuit; and a row decoder.

When a READ command is received as input before the passage of a fixed number of clock cycles from the input of an ACTV command, the control circuit activates the column decoders after the passage of the fixed number of clock cycles; and when a READ command is received as input after the passage of the fixed number of clock cycles after the input of an ACTV command, the control circuit activates the column decoders at the timing of the input of the READ command.

When a READ command is received as input one clock cycle after the input of an ACTV command, the row decoder activates, of the plurality of sub-arrays, only the sub-array having a memory cell that is selected by a row address and column address and performs the operation of reading data; and when a READ command is received as input two or more clock cycles after the input of an ACTV command, the row decoder activates all sub-arrays that are designated by a row address and performs the operation of reading data.

According to the present invention, of the plurality of sub-arrays, only the sub-array that is selected by a row address and column address is activated when a READ command is received as input one clock cycle after the input of an ACTV command. The present invention can therefore more strictly limit the area that must be activated than a semiconductor memory device of the prior art. Thus, in comparison with a semiconductor memory device of the prior art, the present invention can decrease the load on the power supply, shorten the time required for bit lines to attain a stipulated voltage when the bit lines are amplified, reduce the time required for the amplification of bit lines to end, and shorten the time from the input of an ACTV command until the output of data.

In addition, the semiconductor memory device of the present invention can, in comparison with the prior art, shorten the time required for precharging bit lines because fewer areas of the memory cell array are activated. As a result, the present invention can also reduce the number of cycles from the reading of a particular memory cell until the reading of data of the next memory cell.

The present invention can thus increase the data transfer rate in a posted CAS SDRAM.

The semiconductor memory device of the present invention can further reduce power consumption because only some of a plurality of sub-arrays are activated when a READ command is received as input one clock cycle after the input of an ACTV command.

In the semiconductor memory device of the present invention, moreover, the sub-arrays may be constituted by dividing the memory cell array into a plurality of areas so as to allow independent activation, and may be constituted as areas that can each be activated independently by a plurality of sub-word lines that are connected to main word lines from the row decoder.

In another semiconductor memory device of the present invention, the fixed number of clock cycles is tRCD clock cycles to guarantee the time from the input of an ACTV command until the end of amplification of bit lines.

The control method for reading data of the semiconductor memory device of the present invention is a method of controlling the reading of data of a semiconductor memory device that adopts the posted CAS standard for enabling free selection of the timing from the input of an ACTV command, which is a command instructing the selection of a row address, until the input of a READ command, which is a command instructing the selection of a column address, and in which a memory cell array is constituted by a plurality of sub-arrays that can be independently activated; the method being provided with steps of:

reading the data of a memory cell that belongs to a particular sub-array; and when reading the data of a memory cell that belongs to a sub-array that is different from this sub-array, beginning the process of reading the next memory cell without waiting for the completion of precharging of the bit lines of the sub-array for which data reading has been completed.

The present invention enables reading of data at a higher rate than a semiconductor memory device of the prior art because the present invention enables pipeline processing in which, when continuously reading the data of memory cells that belong to different sub-arrays, the selection of a row address for reading the next memory cell in the next sub-array can be performed at the timing of precharging bit lines in the current sub-array.

The above and other objects, features and advantages of the present invention will become apparent from the following description with reference to the accompanying drawings, which illustrate examples of the present invention.

BRIEF DESCRIPTION OF THE DRAWINGS

FIG. 2 is a view showing the correspondence between various commands and the signals that are received in control circuit 11;

DETAILED DESCRIPTION OF THE PREFERRED EMBODIMENTS

First Embodiment

Figure 7:
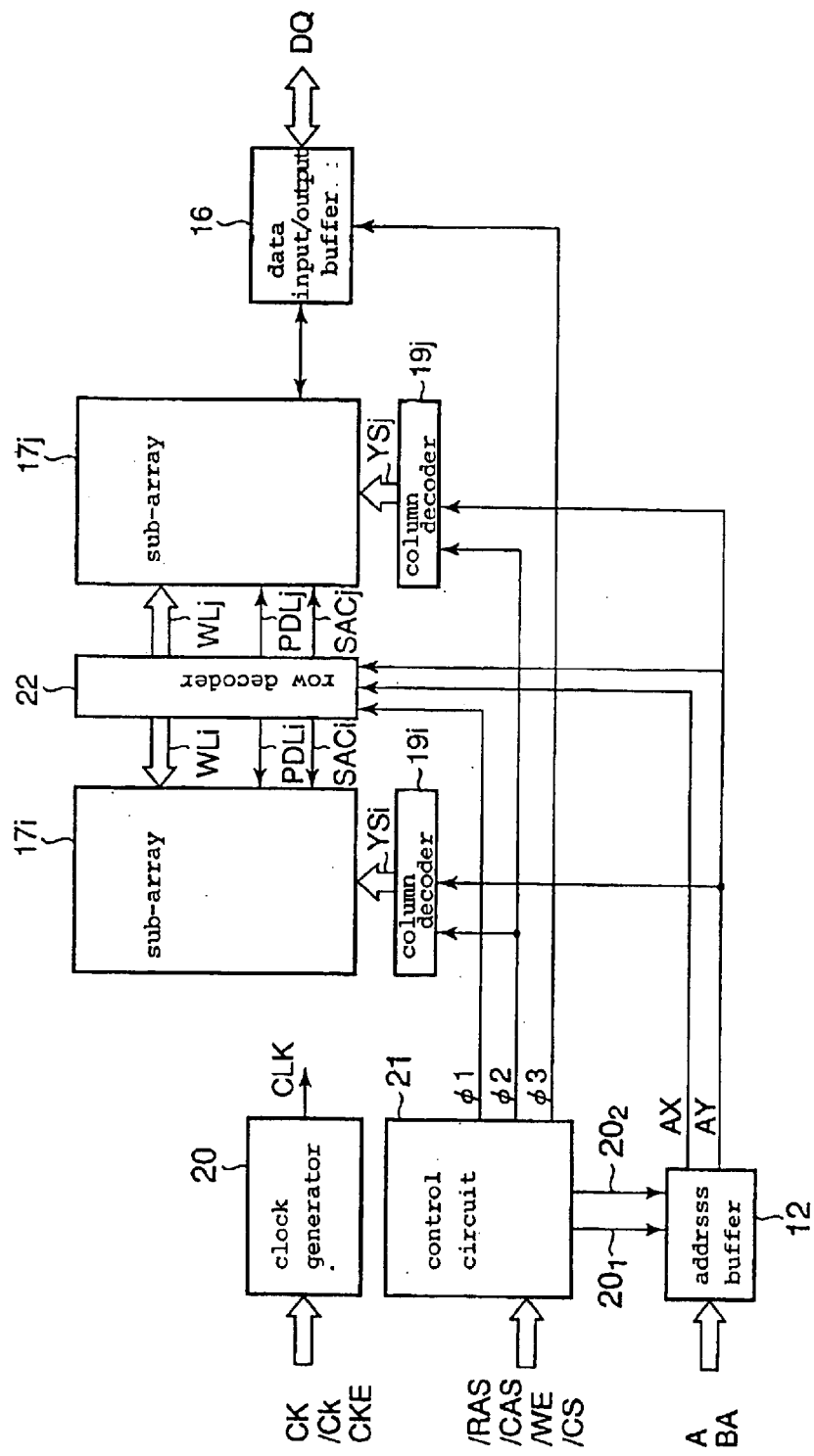
FIG. 7 is a block diagram showing the construction of the semiconductor memory device of the first embodiment of the present invention.

We next refer to FIG. 7, which shows a block diagram of the construction of the semiconductor memory device of the first embodiment of the present invention. In FIG. 7, constituent elements that are identical to elements in FIG. 1 bear the same reference numerals, and redundant explanation is here omitted. In the present embodiment, for example, a case is tRCD=2.

Figure 1:
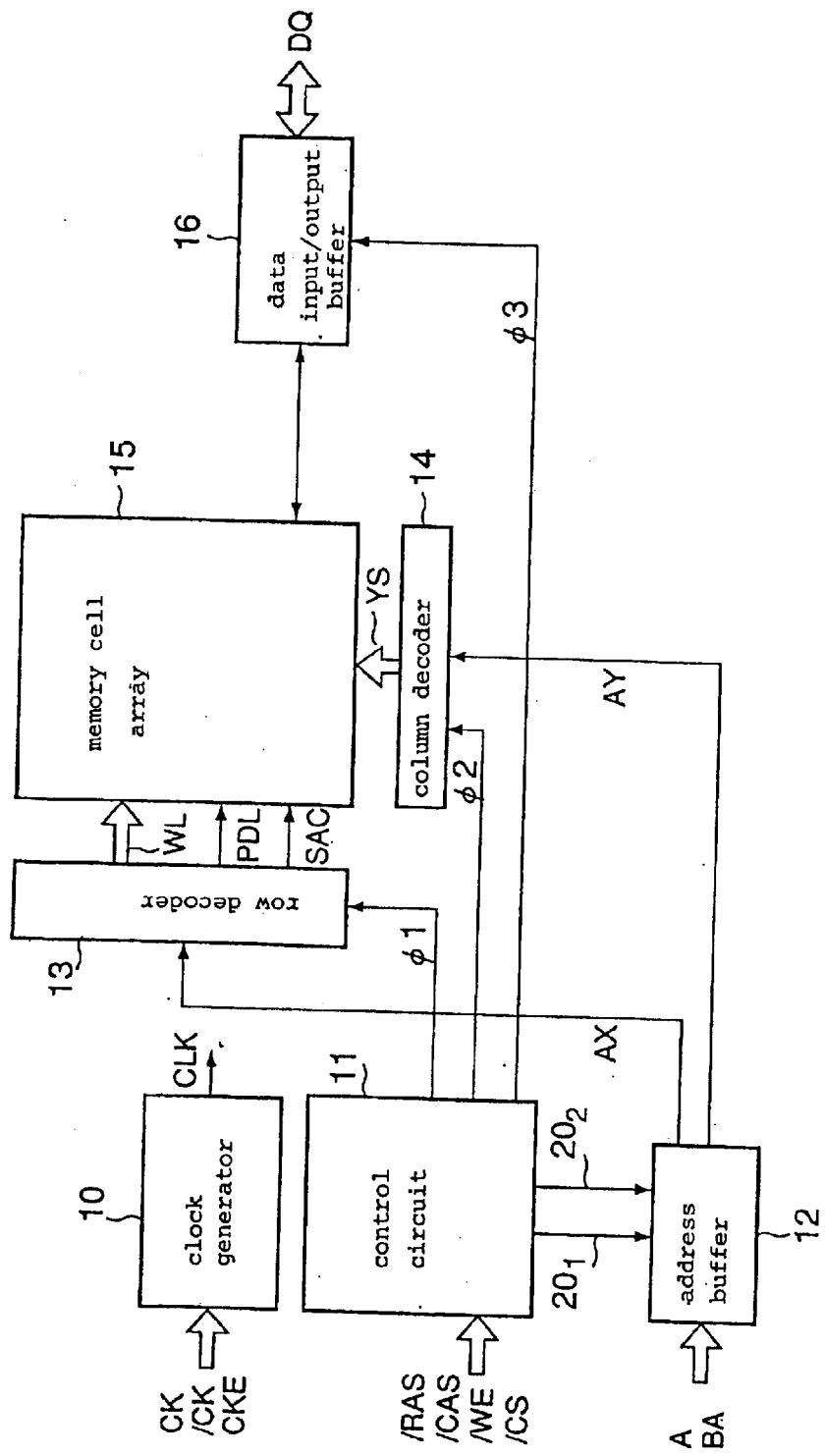
FIG. 1 is a block diagram showing the construction of a semiconductor memory device of the prior art.
Figure 3:
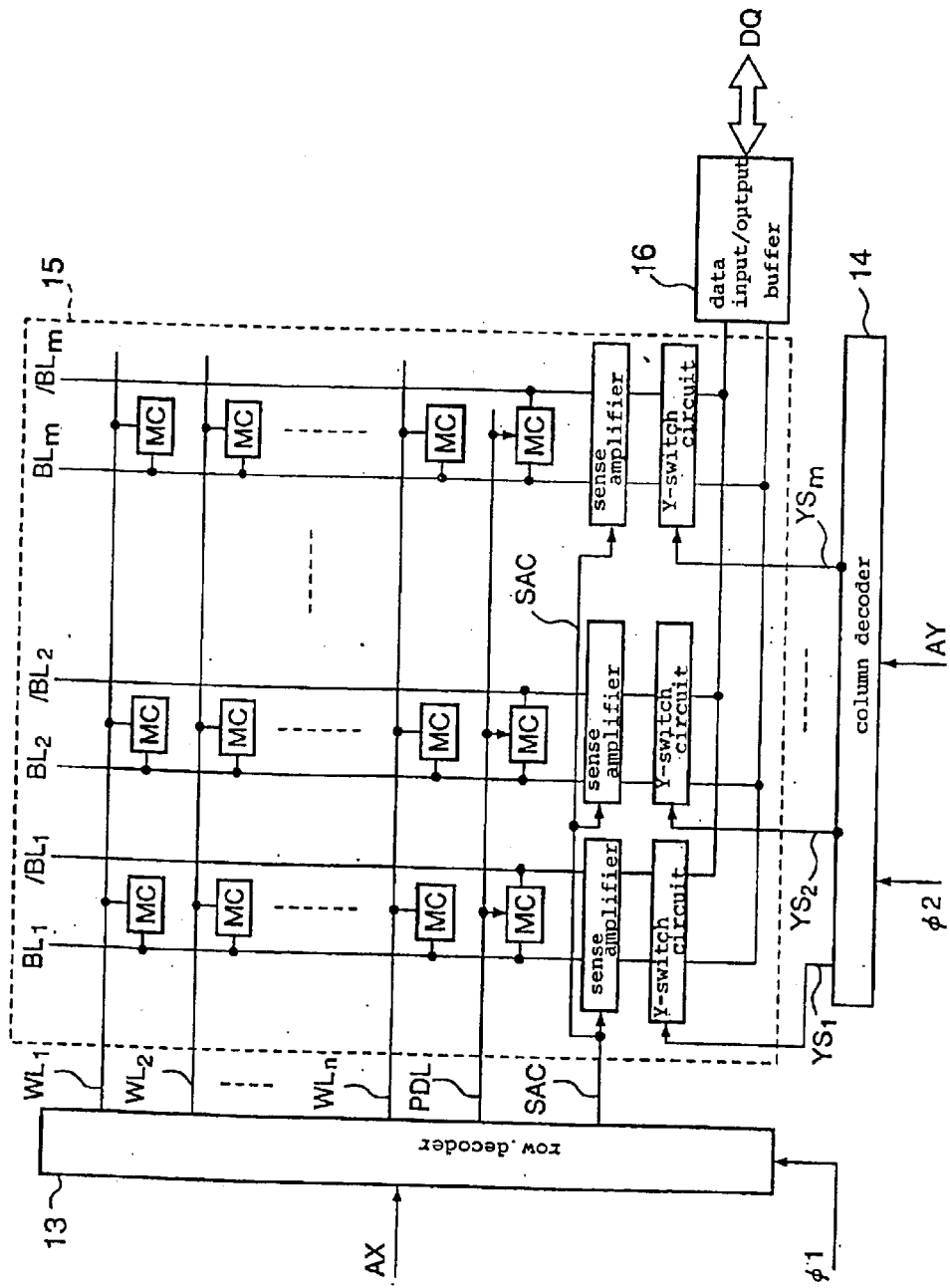
FIG. 3 shows the area that is activated in a memory cell array of a semiconductor memory device of the prior art.
Figure 4:
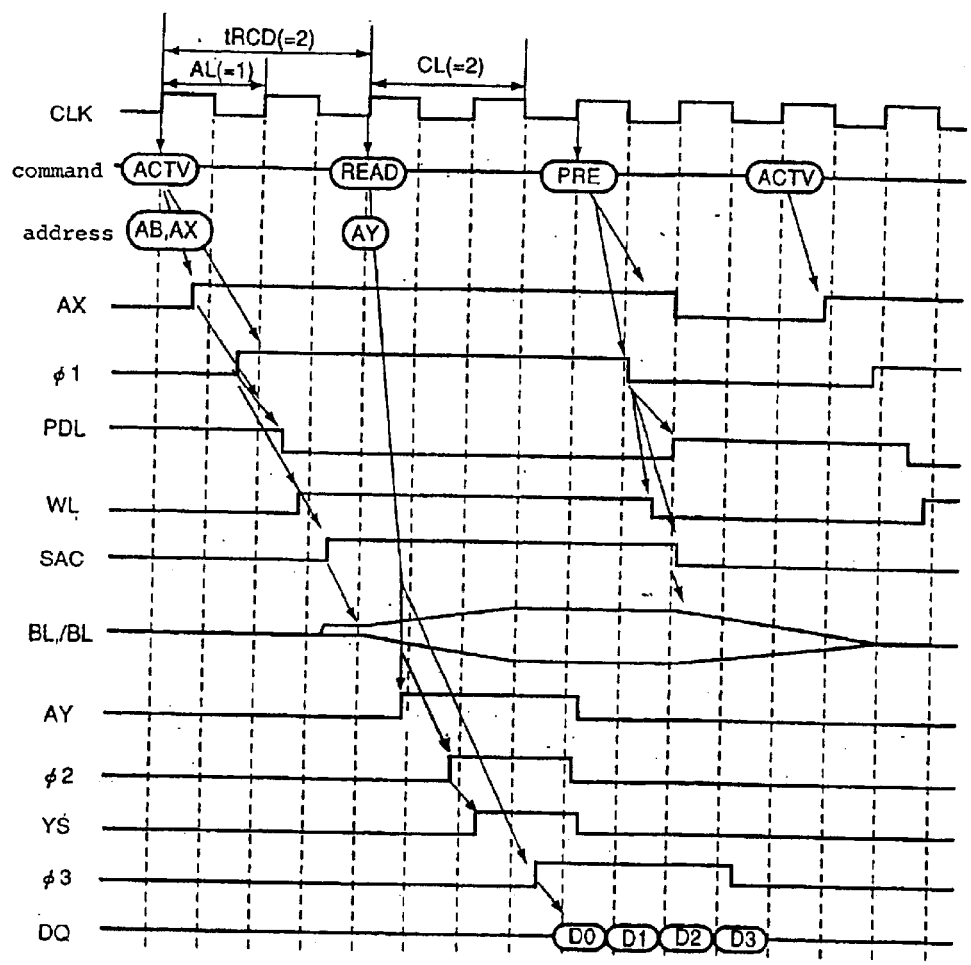
FIG. 4 is a timing chart showing the operation of the semiconductor memory device of the prior art shown in FIG. 1.
Figure 5:
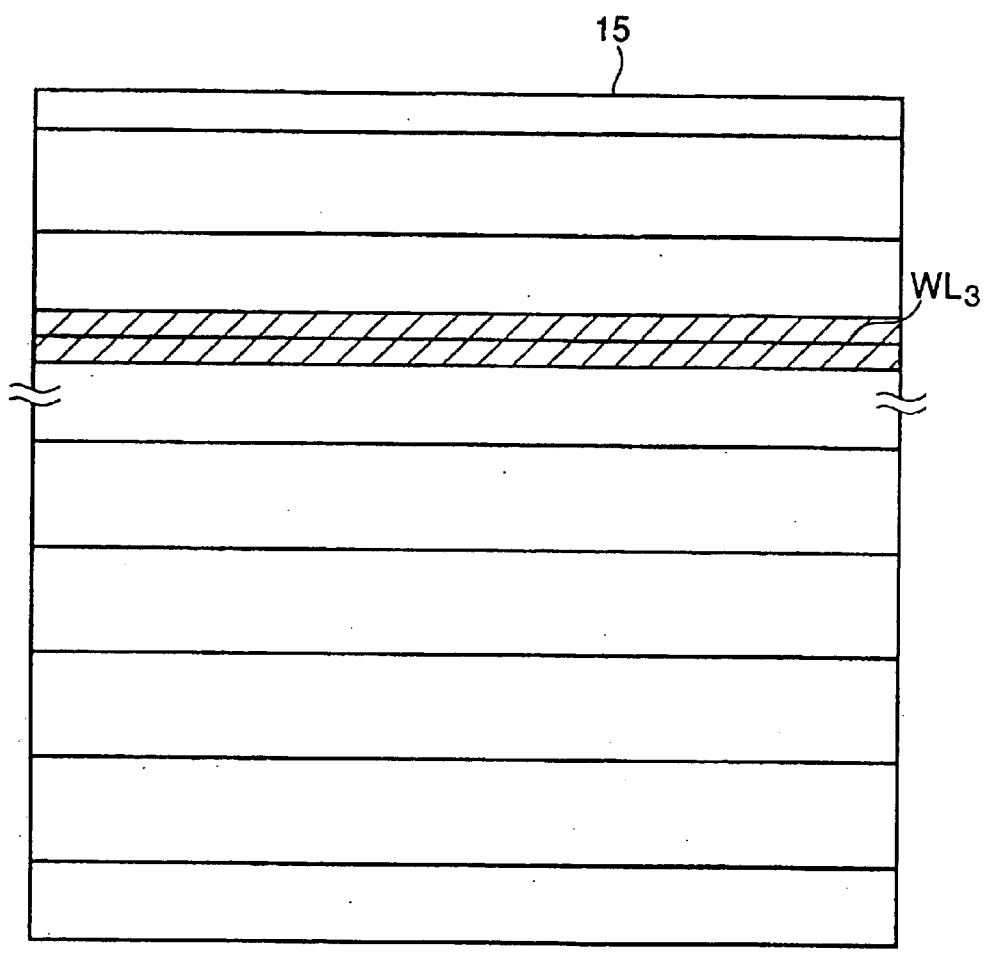
FIG. 5 shows, of the area of memory cell array 15, the area that is activated when reading data of a particular memory cell in a semiconductor memory device of the prior art.
Figure 6:
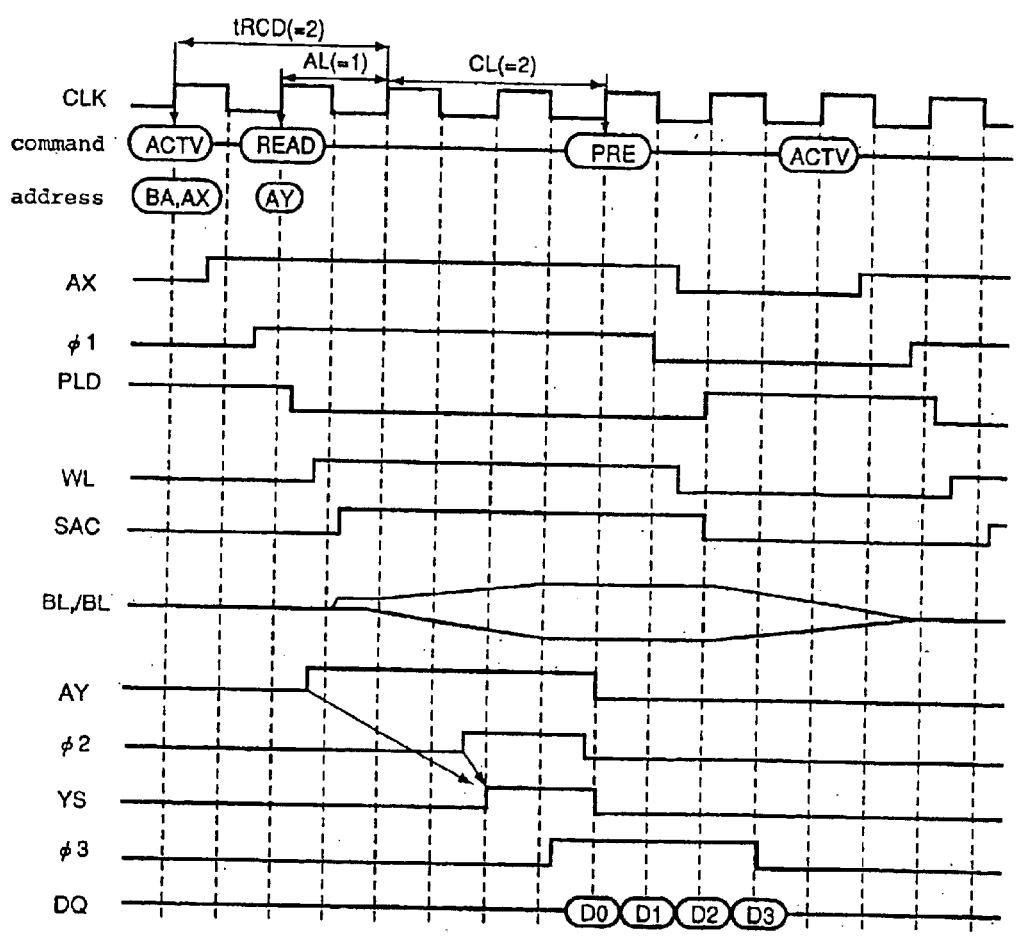
FIG. 6 is a timing chart showing the operation of the semiconductor memory device of the prior art of the posted CAS standard.

In contrast to the semiconductor memory device of the prior art shown in FIG. 1, the semiconductor memory device of the present embodiment has memory cell array 15 that is divided into two sub-arrays 17i and 17j that can be independently activated, column decoder 14 that is divided into column decoders 19i and 19j to correspond to sub-arrays 17i and 17j, and in addition, has control circuit 21 instead of control circuit 11 and row decoder 22 instead of row decoder 13.

Control circuit 21 differs from control circuit 11 of the prior art shown in FIG. 1 only in that it activates control signal $\phi 2$ after the passage of tRCD clock cycles after the input of an ACTV command instead of activating control signal $\phi 2$ immediately after the input of a READ command, and otherwise operates the same as control circuit 11 of the prior art.

Column decoder 19 is divided into column decoders 19i and 19j in accordance with the division of memory cell array 15 of the prior art into two sub-arrays 17i and 17j, and the operation of these column decoders is the same as column decoder 14 in the semiconductor memory device of the prior art that is shown in FIG. 1.

When a READ command is received as input one clock cycle after the input of an ACTV command, row decoder 22 activates only the sub-array of sub-arrays 17i and 17j that contains a memory cell that is selected by row address AX and column address AY and then carries out operations for reading data. When a READ command is received as input two clock cycles after the input of an ACTV command, row decoder 22 activates both of sub-arrays 17i and 17j that are designated by row address AX and performs operations for reading data, as in the prior art. Row decoder 22 uses word line WLi, precharge signal PDLi, and sense amplifier control signal SACi when activating sub-array 17i; and uses word line WLj, precharge signal PDLj, and sense amplifier control signal SACj when activating sub-array 17j.

Details regarding operations when reading data from an SDRAM, which is the semiconductor memory device of the present embodiment shown in FIG. 7, are next described with reference to the accompanying figures. Operations when a READ command is received as input one clock cycle after the input of an ACTV command differ from operations when a READ command is received as input two clock cycles after the input of an ACTV command in the semiconductor memory device of the present embodiment, and the explanation is therefore divided between these two cases.

Figure 8:
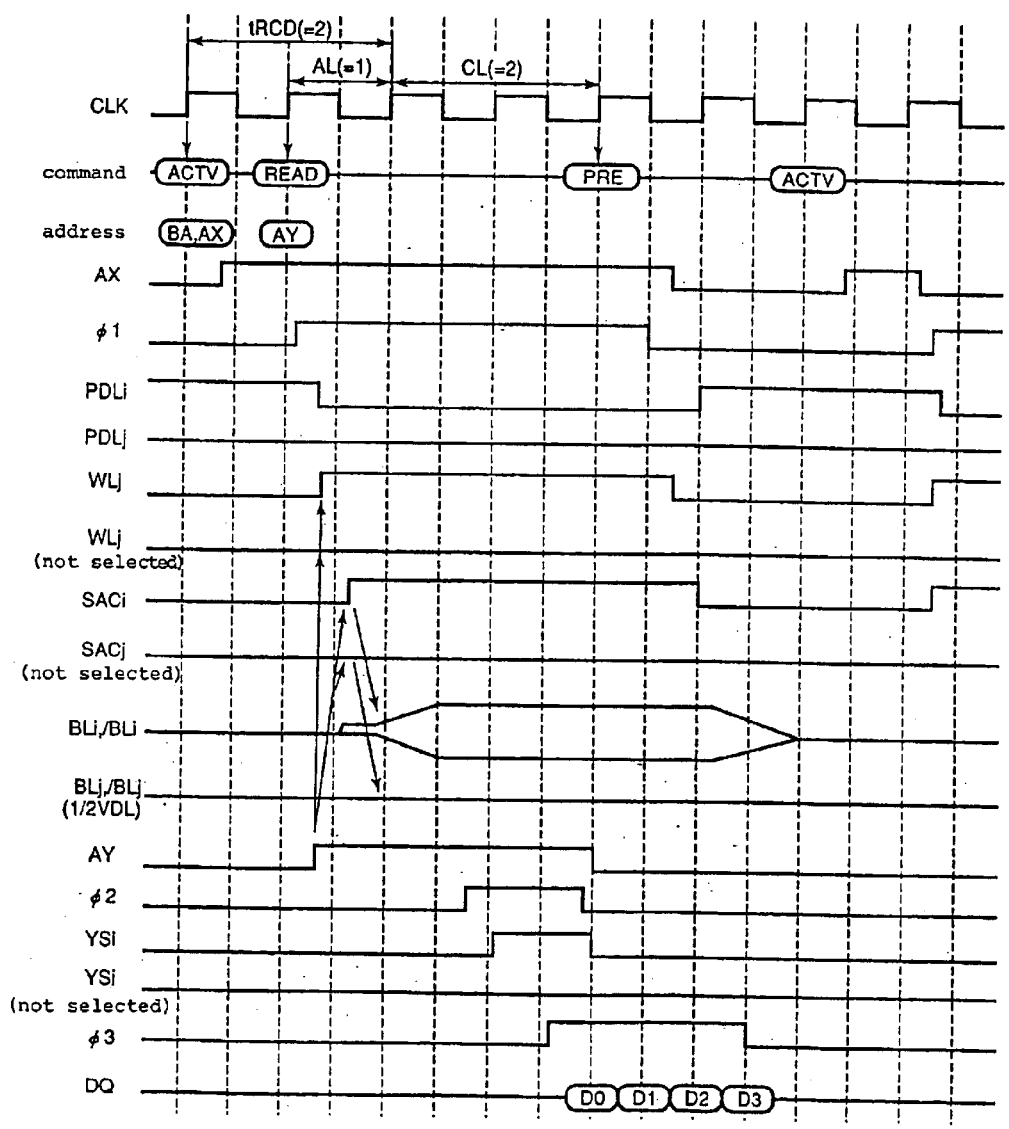
FIG. 8 is a timing chart showing the operation when a READ command is applied as input one clock cycle after the input of an ACTV command in the semiconductor memory device of FIG. 7.

We first refer to the timing chart of FIG. 8 to explain the operations when a READ command is received as input one clock cycle after the input of an ACTV command.

In this case, the input to control circuit 21 of an ACTV command, which is a command instructing the selection of a row address, causes address control signal $20_1$ to be output from control circuit 21 and row address AX to be output from address buffer 12 to row decoder 22. Then, one clock cycle after the input of the ACTV command, a READ command instructing the selection of a column address is received from the external system, whereupon control circuit 21 activates address control signal $20_2$. The activation of control signal $20_2$ causes column address AY to be applied as input from address buffer 12 to column decoders 19i and 19j and row decoder 22. However, control circuit 21 does not activate control signal $\phi 2$ at this time.

Figure 9:
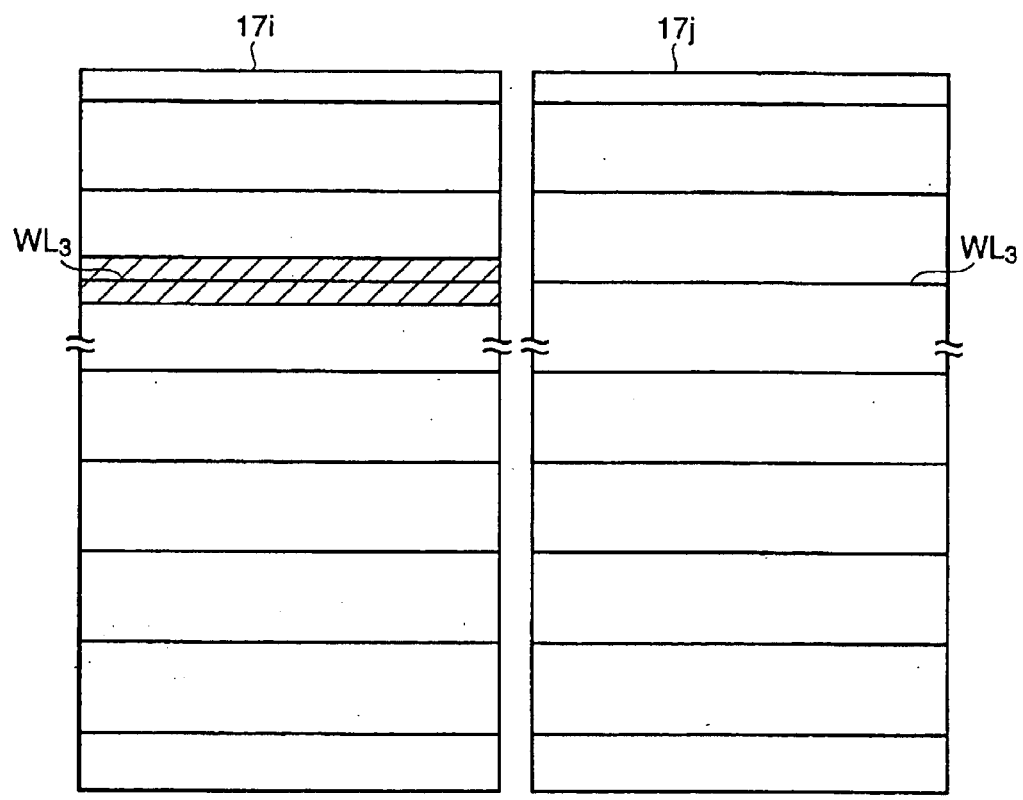
FIG. 9 shows, of the area of sub-arrays 17i and 17j, the area that is activated when reading data of particular memory cells in the semiconductor memory device of the first embodiment of the present invention when a READ command is applied as input one clock cycle after the input of an ACTV command.

Since the memory cell that is indicated by column address AY that has been output from address buffer 12 is in sub-array 17i, when control signal $\phi 1$ from control circuit 21 becomes active, row decoder 22 leaves word line WLj, precharge signal PDLj, and sense amplifier control signal SACj to sub-array 17j unaltered and deactivates precharge signal PDLi to sub-array 17i, and further, selects, of word lines WLi to sub-array 17i, word lines that correspond to row address AX that has been received as input. Row decoder 22 further activates sense amplifier control signal SACi for activating the sense amplifier of sub-array 17i, whereby word line WLi that contains the memory cell that is to be read of sub-array 17i is activated and the data reading of bit lines and amplification of bit lines is performed. FIG. 9 shows, of the area of sub-array 17i, the area that is activated by the processing up to this point. In FIG. 9, row decoder 22 activates only word line $WL_3$ of sub-array 17i, and does not activate word line $WL_3$ of sub-array 17j.

Control circuit 21 then activates control signal $\phi 2$ after the passage of two clocks, which is tRCD, from the input of an ACTV command. This activation of control signal $\phi 2$ causes column decoder 19i to activate, of column selection signal YSi, only the column selection signal that is indicated by column address AY, whereby the memory cell that is to be read is selected. The activation of control signal $\phi 3$ then causes the data from the selected memory cell to be output from data input/output buffer 16 as data DQ.

When precharge command PRE is subsequently applied as input, control circuit 21 makes control signal $\phi 1$ inactive, whereby row decoder 22 deactivates word lines WLi that were active, deactivates sense amplifier control signal SACi, and activates precharge signal PDLi. This process causes bit lines BLi and /BLi to be reset and prepares for reading data of the next memory cell.

Figure 10:
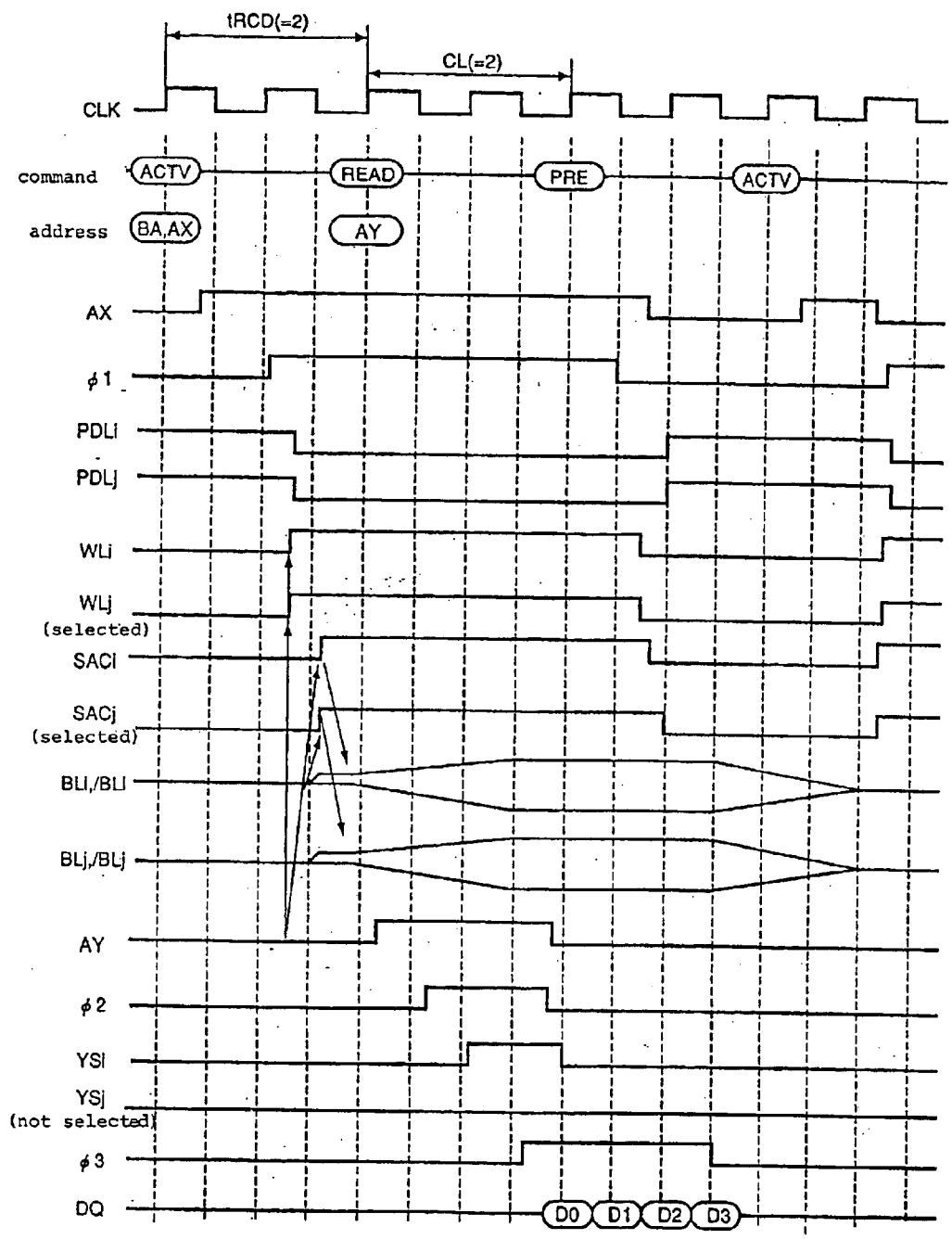
FIG. 10 is a timing chart showing the operation when a READ command is applied as input two clock cycles after the input of an ACTV command in the semiconductor memory device of FIG. 7.
Figure 11:
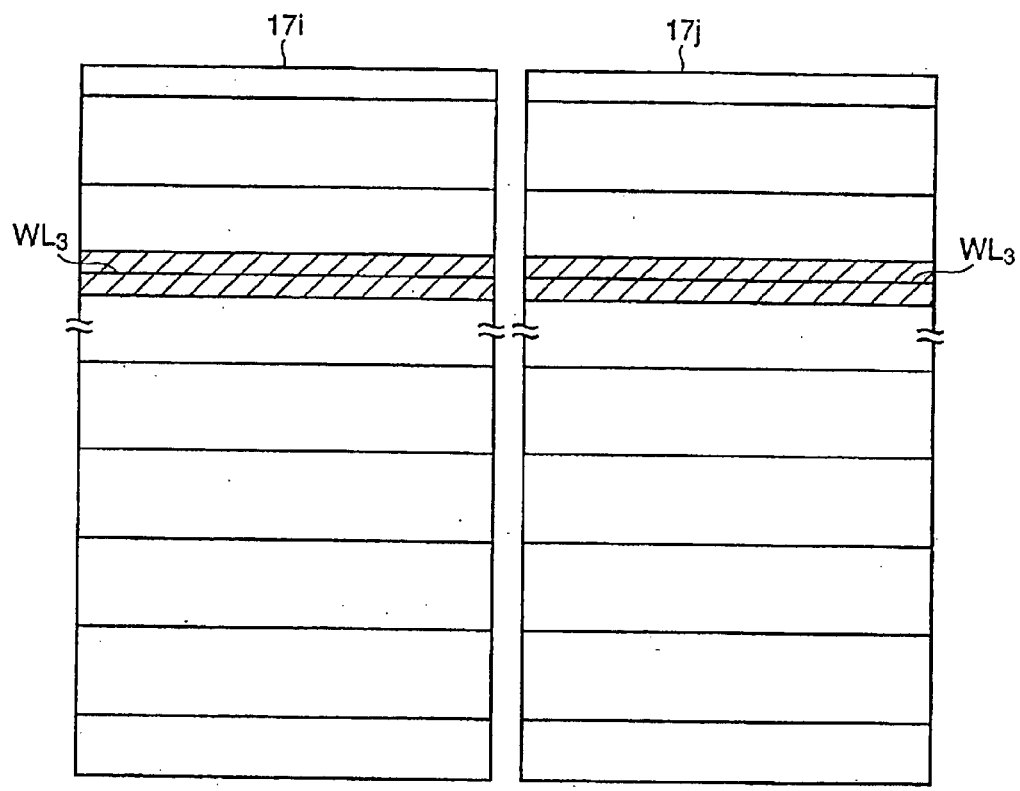
FIG. 11 shows, of the area of sub-arrays 17i and 17j, the area that is activated when reading data of particular memory cells in the semiconductor memory device of the first embodiment of the present invention when a READ command is applied as input two clock cycles after the input of an ACTV command.

The timing chart of FIG. 10 shows the operations for a case in which a READ command is received as input two clock cycles after the input of an ACTV command. In this case, column address AY is not applied as input to row decoder 22 when row decoder 22 activates word lines WL. Accordingly, row decoder 22 is not able to detect the sub-array of sub-arrays 17i and 17j in which resides the memory cell that is to be read. Row decoder 22 therefore controls precharge signals PDLi and PDLj, word lines WLi and WLj, and sense amplifier control signals SACi and SACj at the same timing to activate sub-arrays 17i and 17j. FIG. 11 shows the area that is activated in this case. In FIG. 11, word lines $WL_3$ of both sub-arrays 17i and 17j are activated.

When a READ command is received as input one clock cycle after the input of an ACTV command, the semiconductor memory device of the present embodiment activates only the sub-array of sub-arrays 17i and 17j that is selected by row address AX and column address AY, and therefore, when compared to a semiconductor memory device of the prior art, can limit the area that must be activated. This limitation of activated area reduces the load on the power supply, and when amplifying bit lines BL and /BL, shortens the time required for bit lines BL and /BL to attain the stipulated voltage. The semiconductor memory device of the present embodiment can therefore obtain a reduction in the time required from the input of an ACTV command until the output of data DQ when compared to a semiconductor memory device of the prior art.

Thus, compared to a semiconductor memory device of the prior art, the semiconductor memory device according to the present embodiment is capable of decreasing tRCD if the clock frequency is the same, or of increasing the clock frequency if tRCD is the same. For example, in a case in which tRCD=3 in the prior art, the present embodiment can obtain tRCD=2.

Figure 12:
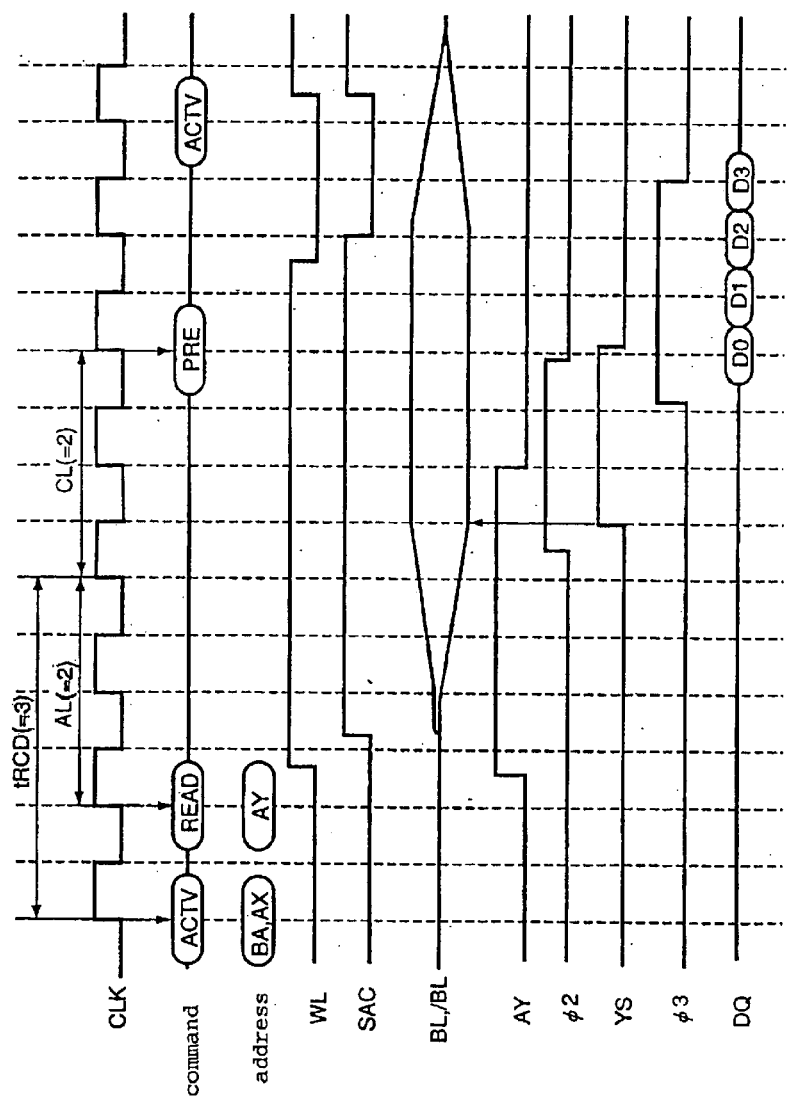
FIG. 12 is a timing chart in a semiconductor memory device of the prior art that is shown for the purpose of comparison to explain the effects obtained by the semiconductor memory device of the first embodiment of the present invention.
Figure 13:
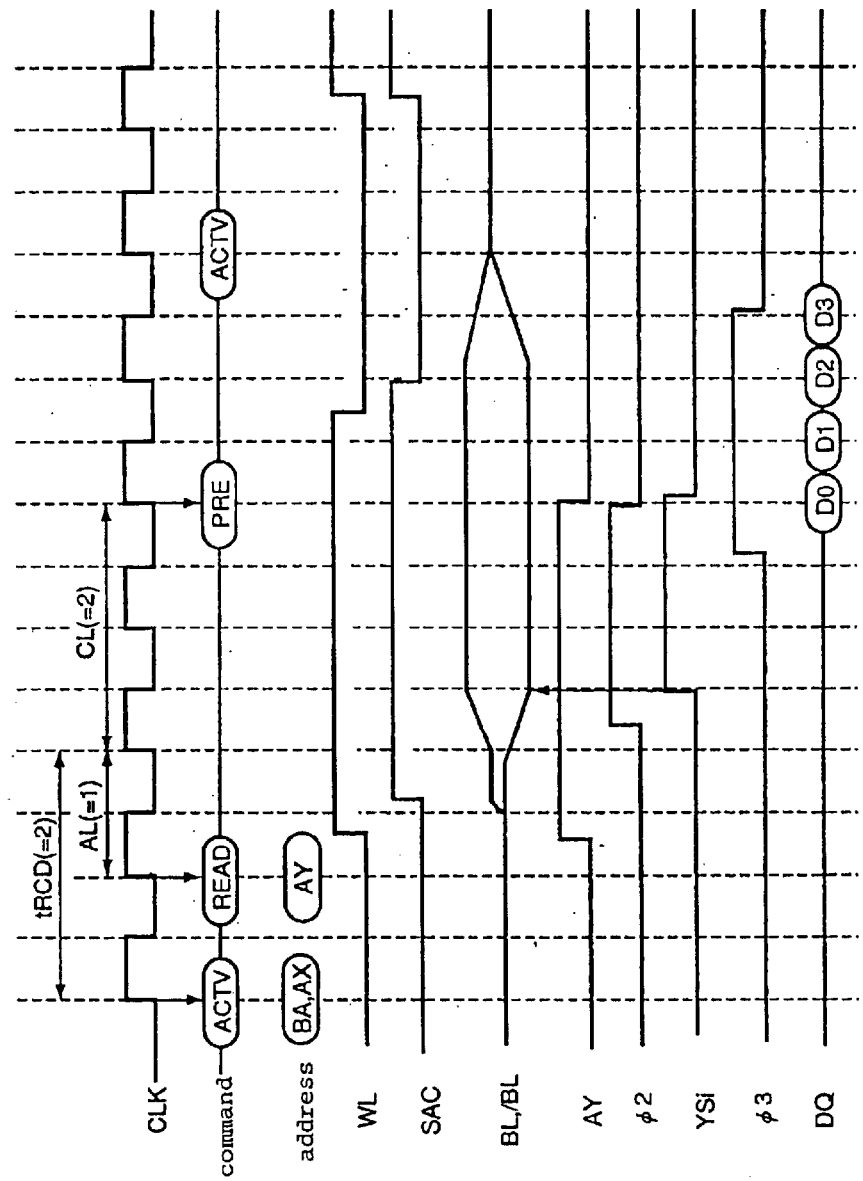
FIG. 13 is a timing chart for explaining the capability of the semiconductor memory device of the first embodiment of the present invention to shorten tRCD.

To explain with reference to a specific case using a timing chart, it is assumed that three clock cycles were required as tRCD in the prior art to activate column selection signal YS after the end of amplification of bit lines BL and /BL shown in FIG. 12. If the present embodiment is applied in such a case, the time from the activation of sense amplifier control signal SAC until the end of amplification of bit lines BL and /BL is shortened as shown in FIG. 13, whereby the amplification of bit lines BL and /BL is completed when column selection signal YS becomes active even when tRCD is made two clocks.

Further, by reducing the area of the memory cell array that is activated, the semiconductor memory device of the present embodiment can make both the time required for amplifying bit lines BL and /BL as well as the time required for precharging bit lines BL and /BL shorter than in the prior art. As a result, the present embodiment can not only reduce the cycles from reading the data of a particular memory cell until reading the data of a next memory cell, but can increase the speed of reading data when compared to a semiconductor memory device of the prior art.

Figure 14:
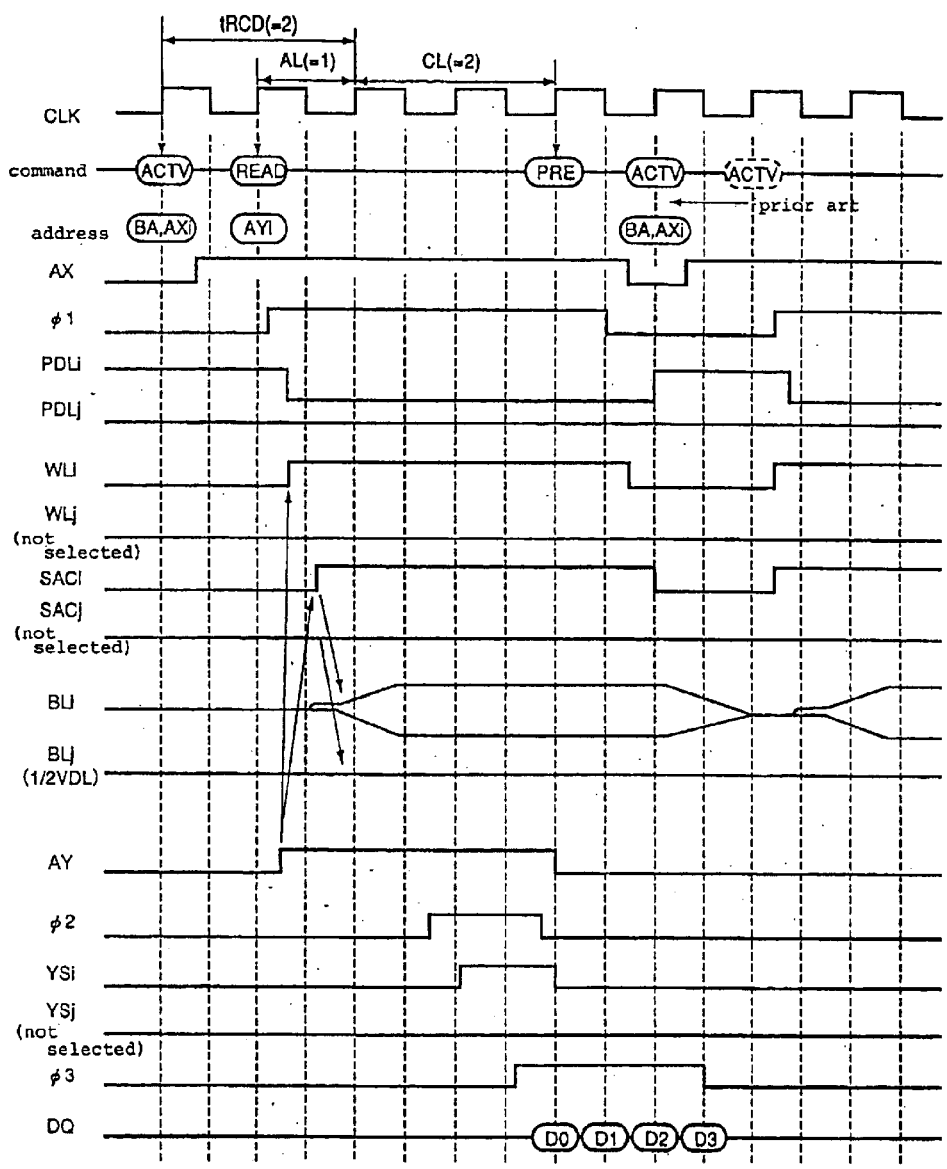
FIG. 14 is a timing chart for explaining operations when continuously reading memory cells of the same memory cell array in the semiconductor memory device of the first embodiment of the present invention.
Figure 15:
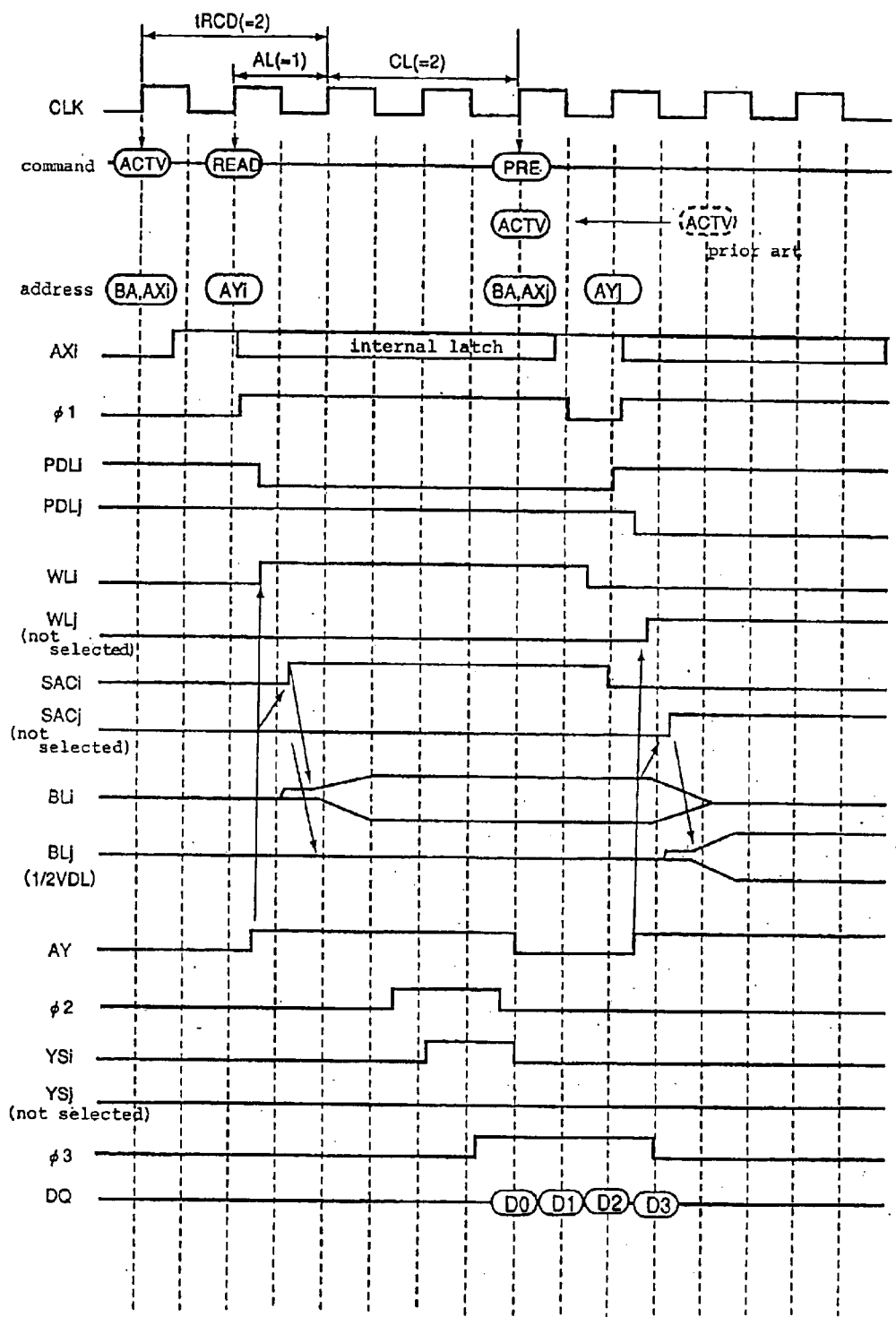
FIG. 15 is a timing chart for explaining operations when reading a particular memory cell and then reading a memory cell of different memory cell array in the semiconductor memory device of the first embodiment of the present invention.

We next refer to FIGS. 14 and 15 to explain the effects of this embodiment. FIG. 14 is a timing chart for explaining the operation when continuously reading memory cells of the same memory cell array in a semiconductor memory device of the first embodiment of the present invention, and FIG. 15 is a timing chart for explaining the operation when reading a memory cell in one memory cell array and then reading a memory cell in a different memory cell array.

The reduction in the time that is required for precharging bit lines that is obtained by the semiconductor memory device of the present embodiment can accelerate the timing at which the ACTV command for a next cycle can be introduced, and, as shown in FIG. 14, the present embodiment can therefore accelerate the timing at which an ACTV command can be introduced over the prior art even when reading memory cells in the same memory cell array. As an example, the timing chart shown in FIG. 14 shows a case in which the introduction of an ACTV command can be set one clock earlier than the prior art.

Further, in addition to the reduction of the time required for precharging bit lines, when reading of a memory cell that belongs to one sub-array is followed in the next cycle by reading a memory cell that belongs to a sub-array that is different from the sub-array in which reading has just been carried out, the semiconductor memory device of the present embodiment allows the processing for reading the next memory cell to start without waiting for the completion of bit line precharging in the sub-array in which data reading was performed. As a result, as shown in FIG. 15, the timing at which an ACTV command can be introduced can be further accelerated and the PRE command and ACTV command can be introduced at the same time. In other words, the present embodiment can realize pipeline processing in which, at the timing of precharging bit lines in one sub-array, selection of a row address is carried out for reading the next memory cell in another sub-array that does not share a sense amplifier. Essentially, the present embodiment can realize an improvement in pipeline processing efficiency because the present embodiment has more divisions of arrays that can be activated than the prior art. As an example, the timing chart of FIG. 15 shows a case in which an ACTV command can be introduced two clocks earlier than in the prior art.

Finally, the semiconductor memory device of the present embodiment activates only one of sub-arrays 17i and 17j when a READ command is applied as input one clock cycle after the input of an ACTV command and therefore can obtain the effect of reducing power consumption.

Second Embodiment

Next, regarding the semiconductor memory device of the second embodiment of the present invention, while the above-described semiconductor memory device of the first embodiment was a device in which one bank was constituted by a plurality of two or more memory cell arrays for enabling a limitation of the area of a memory cell array that is activated, the semiconductor memory device of this embodiment is a device in which the present invention is applied to a semiconductor memory device having a construction in which word lines are divided into a plurality of sub-word lines.

Figure 16:
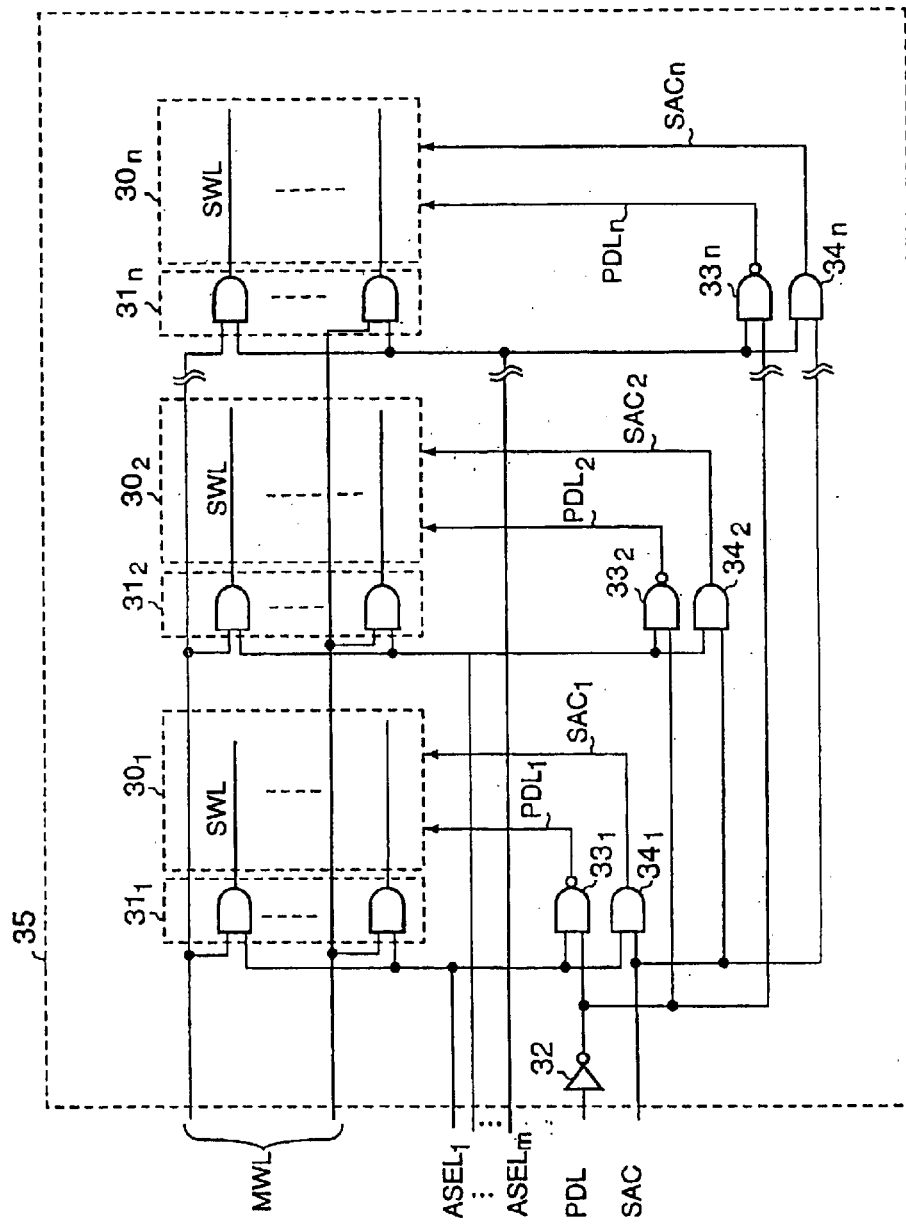
FIG. 16 is a block diagram showing the construction of a memory cell array in the semiconductor memory device of the second embodiment of the present invention.

FIG. 16 shows the construction of a memory cell array 35 in the semiconductor memory device of the present embodiment. Memory cell array 35 in the semiconductor memory device of this embodiment has a plurality of main word lines MWL, and these main word lines MWL are in turn connected to sub-word line drivers 311-31n. Sub-word line drivers 311-31n select and activate a single sub-word line from among the plurality of sub-word lines SWL that are connected based on sub-word line selection signals ASEL1-ASELm. Finally, sub-arrays 301-30n are constituted by connecting memory cells to each of sub-word lines SWL.

Precharge signal PDL that is received as input from the row decoder undergoes logic inversion by inverter 32 and is then applied to NAND circuits $33_1$–$33_n$ to calculate the logical product with sub-word line selection signals $ASEL_1$–$ASEL_m$ to control precharging of only one sub-array from among sub-arrays $30_1$–$30_n$. In addition, sense amplifier control signal SAC that is received as input from the row decoder is similarly applied to AND circuits 341-34n to calculate the logical product with sub-word line selection signals ASEL1-ASELm and thereby control the sense amplifier of only one sub-array among sub-arrays $30_1$–$30_n$.

When a READ command is received as input one clock cycle after the input of an ACTV command, the row decoder in the semiconductor memory device of the present embodiment activates, of sub-arrays $30_1$–$30_n$, only the sub-array that contains the memory cell that has been selected by row address AX and column address AY and then performs operations for reading data. When a READ command is received as input two clock cycles after the input of an ACTV command, the row decoder activates all sub-arrays $30_1$–$30_n$ that are designated by row address AX and performs the operations for reading data, as in the prior art.

Implementing control in this way allows a limitation of the area that must be activated when reading data in a semiconductor memory device having a construction in which a plurality of sub-word lines SWL are connected to main word lines MWL, as in the first embodiment.

Figure 17:
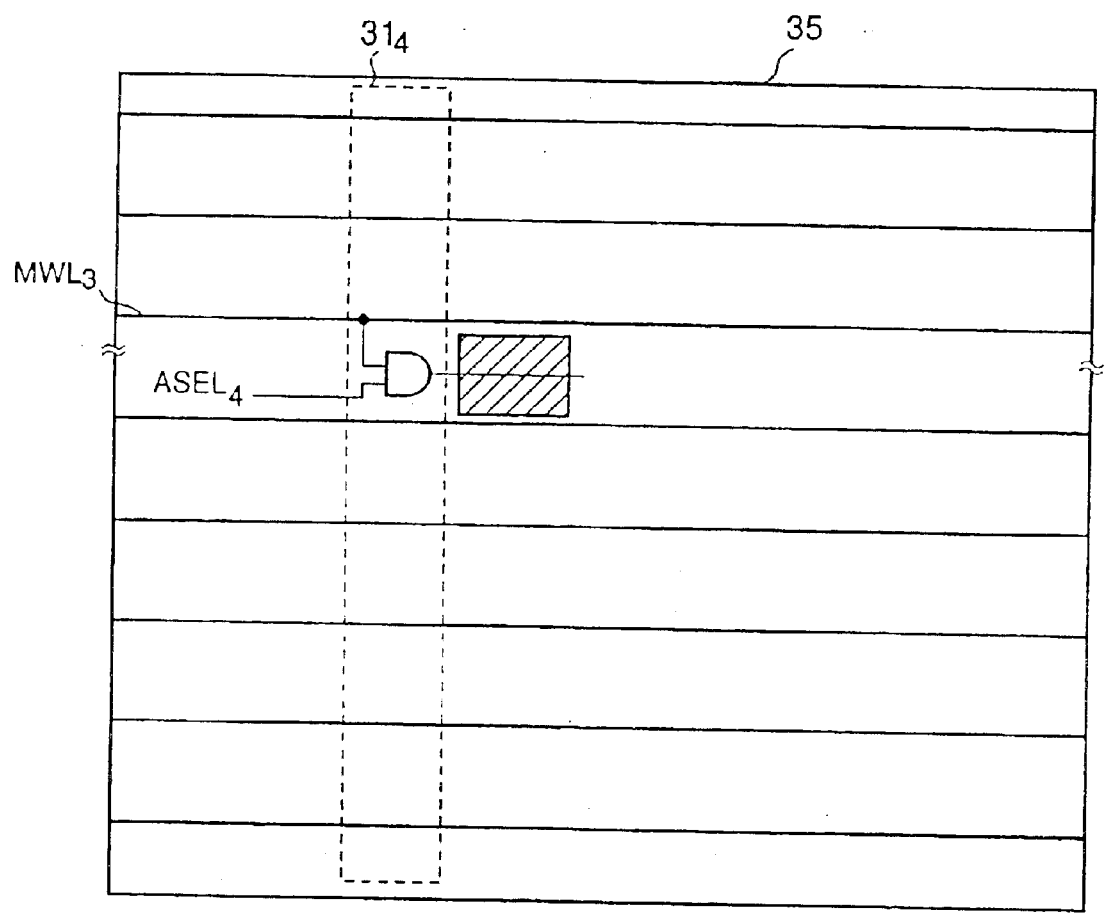
FIG. 17 shows, of the area of memory cell array 35, the area that is activated when reading data of particular memory cells in the semiconductor memory device of the second embodiment of the present invention.

FIG. 17 shows an area that has been activated within the area of memory cell array 35 when reading data of a particular memory cell in the semiconductor memory device of the present embodiment. FIG. 17 shows a case in which, of the sub-word lines that are connected to $MWL_3$, only the sub-word line that is controlled by sub-word line driver 314 is activated.

Although cases in which tRCD=2 clocks were used in the explanation of the above-described first and second embodiments, the present invention is not limited to this form, and the present invention can be similarly applied in cases in which tRCD is three or more clocks. In such cases, operations for reading data are carried out after activating, of a plurality of sub-arrays, only the sub-array that includes the memory cell that is selected by row address AX and column address AY when a READ command is received as input one clock after the input of an ACTV command; and when a READ command is received as input two or more clocks after the input of an ACTV command, operations for reading data are carried out after activating all sub-arrays that are designated by row address AX, as in the prior art.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device, that adopts a CAS standard that allows free selection of the timing from the input of an ACTV command, which is a command instructing the selection of a row address, until the input of a READ command, which is a command instructing the selection of a column address, said semiconductor memory device comprising:

a memory cell array that is constituted from a plurality of sub-arrays that can be independently activated;

column decoders for selecting columns that are specified by a column address that is received as input;

a control circuit for activating said column decoders after the passage of a fixed number of clock cycles when a READ command has been received as an input before the passage of the fixed number of clock cycles after the input of an ACTV command, and activating said column decoders at the timing of the input of a READ command when the READ command is received as input after the passage of said fixed number of clock cycles after the input of an ACTV command; and a row decoder for activating, of said plurality of sub-arrays, only the sub-array containing a memory cell that is selected by a row address and column address when a READ command is received as input one clock cycle after the input of an ACTV command and then performing operations for reading data, and for activating all sub-arrays that are specified by a row address when a READ command is received as input two or more clock cycles after the input of an ACTV command and then performing operations for reading data.

2. A semiconductor memory device according to claim 1, wherein said sub-arrays are obtained by dividing said memory cell array into a plurality of areas so as to allow independent activation.

3. A semiconductor memory device according to claim 1, wherein said sub-arrays are areas that can each be independently activated by a plurality of sub-word lines that are connected to main word lines from said row decoder.

4. A semiconductor memory device according to claim 1, wherein said fixed number of clock cycles is tRCD clock cycles for ensuring the time from the input of an ACTV command until the completion of amplification of bit lines.

5. A semiconductor memory device according to claim 2, wherein said fixed number of clock cycles is tRCD clock cycles for ensuring the time from the input of an ACTV command until the completion of amplification of bit lines.

6. A semiconductor memory device according to claim 3, wherein said fixed number of clock cycles is tRCD clock cycles for ensuring the time from the input of an ACTV command until the completion of amplification of bit lines.

7. A method of controlling the reading of data of a semiconductor memory device that adopts a CAS standard that allows free selection of the timing from the input of an ACTV command, which is a command instructing selection of a row address, until the input of a READ command, which is a command instructing the selection of a column address, and in which a memory cell array is constituted by a plurality of sub-arrays that can be independently activated, said method comprising steps of:

reading data of a memory cell that belongs to a particular sub-array; and when reading data of a memory cell that belongs to a sub-array that is different from said particular sub-array, beginning the processing for reading the next memory cell without waiting for completion of precharging of bit lines of said particular sub-array in which data reading has been completed.

* * * * *